(12) United States Patent
Liabraaten

(10) Patent No.: US 9,799,380 B2
(45) Date of Patent: Oct. 24, 2017

(54) MANAGING OPEN TABS OF AN APPLICATION

(71) Applicant: Google Inc., Mountain View, CA (US)

(72) Inventor: Lane Liabraaten, Leesburg, VA (US)

(73) Assignee: Google Inc., Mountain View, CA (US)

(*) Notice: Subject to any disclaimer, the term of this patent is extended or adjusted under 35 U.S.C. 154(b) by 551 days.

(21) Appl. No.: 14/072,543

(22) Filed: Nov. 5, 2013

(65) Prior Publication Data

US 2015/0127897 A1    May 7, 2015

(51) Int. Cl.
| | |
|---|---|
| *G06F 17/21* | (2006.01) |
| *G11C 7/10* | (2006.01) |
| *G06F 9/50* | (2006.01) |
| *G06F 12/02* | (2006.01) |
| *G06F 12/08* | (2016.01) |
| *G06F 12/12* | (2016.01) |

(52) U.S. Cl.
CPC .......... *G11C 7/1075* (2013.01); *G06F 9/5022* (2013.01); *G06F 12/023* (2013.01); *G06F 12/08* (2013.01); *G06F 12/12* (2013.01); *G06F 2212/1044* (2013.01)

(58) Field of Classification Search
CPC ...... G11V 7/1075; G06F 9/5022; G06F 12/00
USPC .......................................................... 715/243
See application file for complete search history.

(56) References Cited

U.S. PATENT DOCUMENTS

| | | | |
|---|---|---|---|
| 8,341,519 B1 | 12/2012 | Warr et al. | |
| 9,244,705 B1* | 1/2016 | Bondalapati | G06F 9/45504 |
| 2003/0195963 A1* | 10/2003 | Song | H04L 67/142 709/227 |
| 2007/0050449 A1* | 3/2007 | Beck | H04L 67/142 709/204 |
| 2008/0104500 A1* | 5/2008 | Chalemin | G06F 17/243 715/224 |
| 2008/0120368 A1* | 5/2008 | Gale | G06F 17/2211 709/203 |
| 2009/0019133 A1* | 1/2009 | Brimley | G06F 17/30902 709/218 |
| 2011/0252356 A1* | 10/2011 | Morris | G06F 9/4443 715/772 |
| 2012/0060083 A1* | 3/2012 | Yuan | G06F 17/30899 715/234 |
| 2012/0096058 A1* | 4/2012 | Mameri | G06F 17/30902 707/827 |
| 2012/0102495 A1* | 4/2012 | Gangam | G06F 9/485 718/102 |
| 2012/0331407 A1 | 12/2012 | Ainslie et al. | |

(Continued)

*Primary Examiner* — Frank D Mills
(74) *Attorney, Agent, or Firm* — McDermott Will & Emery LLP

(57) ABSTRACT

Systems and methods for managing open tabs of an application are provided. In some aspects, a page is presented in a first tab from among multiple tabs open in an application at a computing device. That a content of the page presented in the first tab is different from a default content of the page stored at a web server is determined. Contents of the multiple tabs are retained in a random access memory (RAM). A request is received to reduce an amount of the RAM used by the application. The content of the page presented in the first tab is stored. In response to the request to reduce the amount of the RAM used by the application, a content presented in a second tab from among the plurality of tabs is removed from the RAM.

19 Claims, 4 Drawing Sheets

(56) References Cited

U.S. PATENT DOCUMENTS

| | | | | |
|---|---|---|---|---|
| 2013/0014047 A1* | 1/2013 | Joo | G06F 3/04886 | 715/777 |
| 2013/0061159 A1 | 3/2013 | Tseng et al. | | |
| 2013/0067186 A1* | 3/2013 | Pronovost | G06F 12/02 | 711/170 |
| 2013/0080930 A1* | 3/2013 | Johansson | G06F 9/46 | 715/760 |
| 2013/0097484 A1* | 4/2013 | Nakamura | G06F 17/30867 | 715/234 |
| 2014/0365794 A1* | 12/2014 | Decker | G06F 1/3246 | 713/320 |
| 2015/0095758 A1* | 4/2015 | Rossi | G06F 17/3089 | 715/234 |
| 2015/0095838 A1* | 4/2015 | Rossi | G06F 3/0483 | 715/777 |

* cited by examiner

MANAGING OPEN TABS OF AN APPLICATION

BACKGROUND

The subject technology is generally directed to managing open tabs of an application.

When a mobile device operating system starts running out of memory, the mobile device operating system may either request that running applications free some memory or kill applications until enough free memory to continue the operation of the mobile device operating system is available. A user may enter data into a form (e.g., a job application, a form for making a purchase in an online store, etc.) displayed on a webpage in a tab of a web browser. If the web browser evicts the tab in order to free the memory, the data entered by the user in the form may be lost. As the foregoing illustrates, a new approach for managing open tabs of a web browser when the web browser is requested to free some memory may be desirable.

SUMMARY

In some aspects, the disclosed subject matter relates to a computer-implemented method for storing content of an application. The method includes presenting a page in a first tab from among multiple tabs open in an application at a computing device. The method includes determining that a content of the page presented in the first tab is different from a default content of the page stored at a web server. The method includes retaining contents of the multiple tabs in a random access memory (RAM). The method includes receiving a request to reduce an amount of the RAM used by the application. The method includes storing the content of the page presented in the first tab. The method includes removing from the RAM, in response to the request to reduce the amount of the RAM used by the application, a content presented in a second tab from among the multiple tabs, the second tab being different from the first tab.

In some aspects, the disclosed subject matter relates to a non-transitory computer-readable medium encoded with executable instructions. The instructions include code for presenting a page in a first tab from among multiple tabs open in an application at the computer. The instructions include code for determining that a content of the page presented in the first tab is different from a default content of the page stored at a web server. The instructions include code for retaining contents of the multiple tabs in a random access memory (RAM). The instructions include code for receiving a request to reduce an amount of the RAM used by the application. The instructions include code for storing the content of the page presented in the first tab. The instructions include code for removing from the RAM, in response to the request to reduce the amount of the RAM used by the application, a content of a second page presented in a second tab from among the multiple tabs, the second tab being different from the first tab, where the content of the second page presented in the second tab is identical to a default content of the second page stored at a second web server.

In some aspects, the disclosed subject matter relates to a system. The system includes one or more processors, a random access memory (RAM), and a disk. The disk stores instructions. The instructions include code for presenting a page in a first tab from among multiple tabs open in an application at the computing device. The instructions include code for determining that a content of the page presented in the first tab is different from a default content of the page stored at a web server. The instructions include code for retaining contents of the multiple tabs in the RAM. The instructions include code for receiving a request to reduce an amount of the RAM used by the application. The instructions include code for removing from the RAM, in response to the request to reduce the amount of the RAM used by the application, a content presented in a second tab from among the multiple tabs. The instructions include code for foregoing removing from the RAM, in response to the request to reduce the amount of the RAM used by the application, the content of the page presented in the first tab.

It is understood that other configurations of the subject technology will become readily apparent from the following detailed description, where various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

Features of the subject technology are set forth in the appended claims. However, for purpose of explanation, several aspects of the disclosed subject matter are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent that the subject technology is not limited to the specific details set forth herein and may be practiced without these specific details. In some instances, certain structures and components are shown in block diagram form in order to avoid obscuring the concepts of the subject technology.

The subject technology provides techniques for managing open tabs of an application, for example, a web browser. According to some implementations, a computing device presents a page in a first tab from among multiple open tabs in the application. The computing device determines that a content of the page presented in the first tab is different from a default content of the page stored at the web server. For example, a user of the computing device may type information into a form on the page or the page may be updated at the web server and the update may not be provided to the computing device. The computing device may shift focus away from the application while retaining contents of the multiple tabs in a random access memory (RAM). Immediately before focus is shifted away from the application, either the first tab or another tab may have focus in the application. The computing device may receive a request to reduce an amount of RAM used by the application, for example, if another application requests RAM. The request to reduce the amount of the RAM used by the application may be a memory warning provided to the application. The computing device may store, either in the RAM or at a disk, the content of the page presented in the first tab. The computing device may remove from the RAM, in response to the request to reduce the amount of the RAM used by the application, a content presented in a second tab from among the multiple tabs. The second tab may be different from the first tab. The computing device may retain, in the RAM, the uniform resource locator (URL) address of the second tab to be able to re-access the second tab when the application is re-opened.

As used herein, the phrase "default content of the page stored at the web server," encompasses its plain and ordinary meaning. The phrase "default content of the page stored at the web server" may refer to, among other things, a version of a page as it appears when it is first loaded from the web server at the client computing device, without any modifications (e.g., entered text, selected buttons, etc.) by the user of the client computing device.

Figure 1:
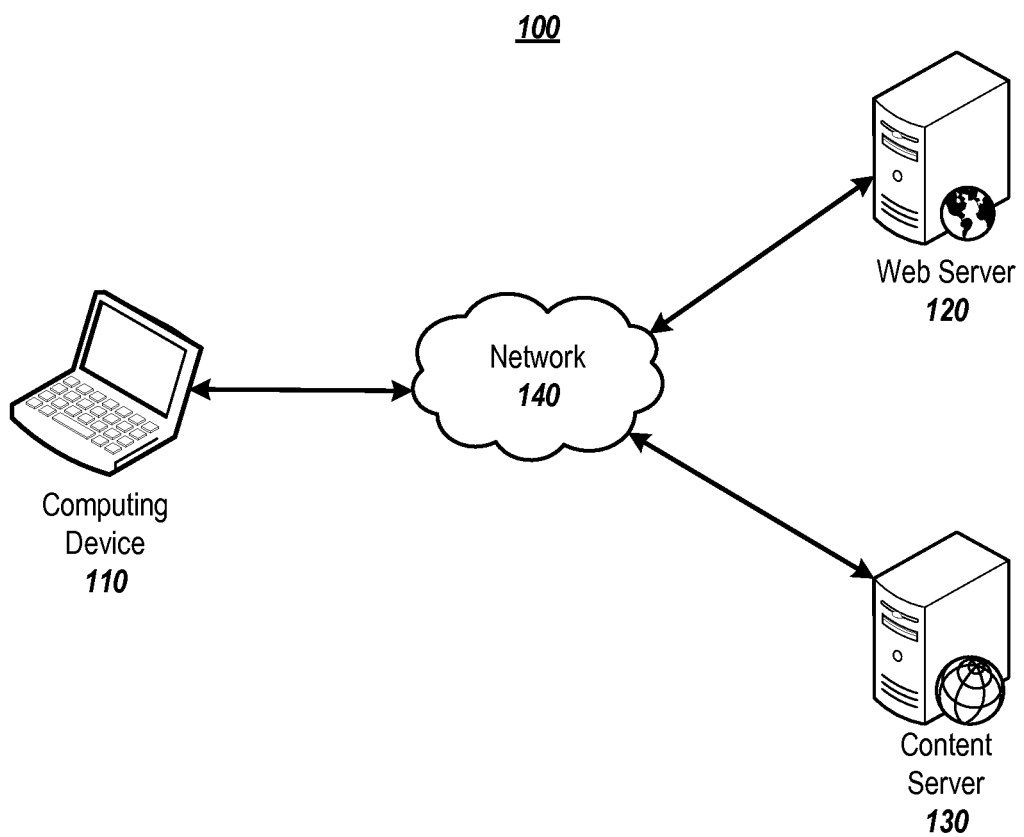
FIG. 1 illustrates an example system for managing open tabs of an application.

FIG. 1 illustrates an example system 100 for managing open tabs of an application.

As shown, the system 100 includes a computing device 110, a web server 120, and a content server 130 connected with one another via a network 140. The network 140 may include the Internet, a cellular network, a local area network, a wide area network, a wired network, a wireless network, a virtual private network, an intranet, etc.

The computing device 110 may be a laptop computer, a desktop computer, a tablet computer, a mobile phone, a personal digital assistant (PDA), a digital music player, a smart watch, etc. The computing device 110 includes an application (e.g., a web browser) for accessing content at the web server 120. Open tabs of the application may be managed, using the techniques described herein, to reduce usage of the RAM of the computing device 110. The computing device is described in greater detail below in conjunction with FIG. 2.

The web server 120 stores information accessible to the computing device 110 via the application. For example, the web server 120 may host a web page or information accessible via a mobile phone or tablet computer application (e.g., an online banking application, a social networking application, etc.).

The content server 130 stores information associated with the computing device 110 and a user account. For example, the content server 130 may store a set of tabs open at the computing device 110 and information presented within the tabs. The information about the computing device 110 stored at the content server 130 may be stored in association with an account of the computing device 110, so that a user of the account of the computing device 110 may access the information via a computer different from the computing device 110. This may be useful, for example, in a case of a crash of the computing device 110.

Figure 2:
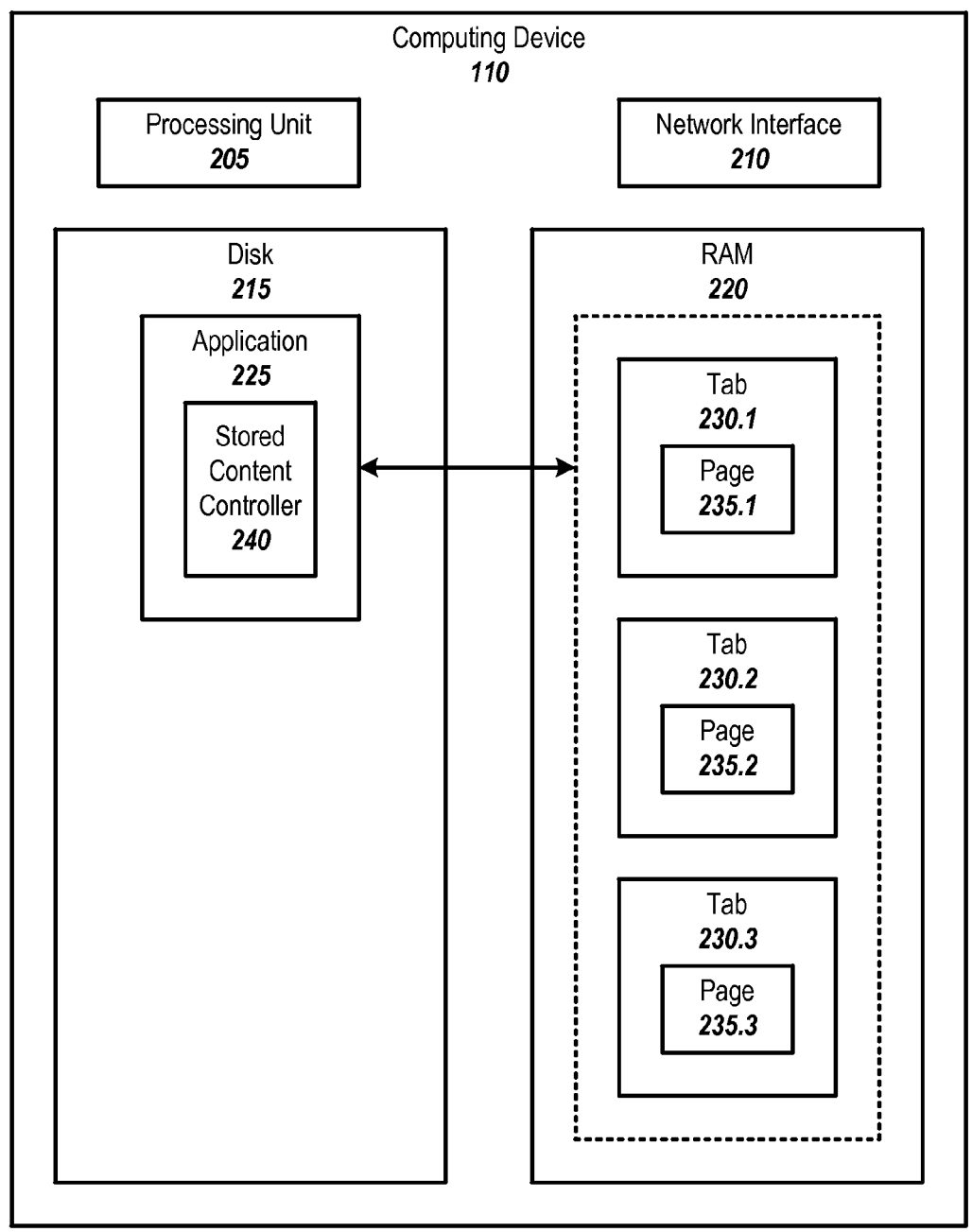
FIG. 2 illustrates an example of the computing device of FIG. 1.

FIG. 2 illustrates an example of the computing device 110 of FIG. 1.

As shown, the computing device 110 includes a processing unit 205, a network interface 210, a disk 215, and a random access memory (RAM) 220. The processing unit 205 includes one or more processors. The processing unit 205 may include a central processing unit (CPU), a graphics processing unit (GPU), or any other processing unit. The processing unit 205 executes computer instructions that are stored in a computer-readable medium, for example, the memory 215. The network interface 210 allows the computing device 200 to transmit and receive data in the network (e.g., network 140). The network interface 210 may include one or more network interface controllers (NICs). The RAM 220 functions as the short-term memory for the computing device 110 and stores information for programs that are currently running, open files, etc. The RAM 220 relies on a current power supply to maintain and access information stored therein. The disk 215 functions as the long-term memory for the computing device 110. The disk may include a magnetic disk, a hard drive, etc. The computing device 110 may access data stored in the RAM 220 nearly instantly (e.g., within a threshold amount of time, for example, 0.5 seconds, 1 second, 10 seconds, etc., depending on a processing speed of the processing unit 205). Data stored on the disk 215 may be located, read, and sent to the RAM 220 before processing of the data, in the RAM 220, by the processing unit 205.

As illustrated, the disk 215 stores an application 225. The application 225 includes a stored content controller 240, residing at the disk 215 (which may be copied to the RAM 220 for execution). The RAM 220 stores tabs 230.1-3 of the application 225. Each tab 230.$k$ (where k is a number between 1 and 3) presents a page 235.$k$. While the subject technology is illustrated in FIG. 2 with three tabs 230.1-3 of the application 225, the subject technology may be implemented with any number of tabs, for example, a single tab, two tabs, three tabs, or more than three tabs. According to some examples, the application 225 is a web browser. Each tab 230.$k$ presents a page 235.$k$, which is a webpage having a uniform resource locator (URL) address, for example, www.example.com.

The stored content controller 240 stores instructions which, when executed by the processing unit 205, cause the processing unit 205 to present the page 235.$k$ in the tab 230.$k$. The processing unit 205 determines that a content of the page 235.$k$ presented in the tab 230.$k$ is different from a content of the page stored at the web server 120. For example, a user of the computing device 110 may type information into a form on the page 235.$k$ or the page 235.$k$ may be updated at the web server 120 and the update may not be provided to the computing device 110. The processing unit 205 retains contents (e.g., pages 235.1-3, including page 235.$k$) of the open tabs (e.g., tabs 230.1-3, including tab 230.$k$) in the RAM 220. The contents of the open tabs may be retained in the RAM 220 in response to a request to shift focus away from the application 225, which may include a request to minimize the application 225 or a request to place focus on another application different from the application 225. Alternatively, the contents of the open tabs may be retained in the RAM 220 at any other time, for example, while the application 225 is active and displaying one of the tabs 230.1-3, which may be the same as or different from the tab 230.$k$. The processing unit 205 receives a request to reduce an amount of RAM 220 used by the application 225, for example, a memory warning. The content of the page 235.$k$ presented in the tab 230.$k$ is stored either, in the RAM 220, at the disk 215, or at the content server 130. The processing unit 205 removes from the RAM 220, in response to the request to reduce the amount of RAM 220 used by the application 225, a content of a page 235.$m$ presented in a second tab 230.$m$ (where m is a number between 1 and 3 different from k) from the multiple tabs. The second tab 230.$m$ is different from the tab 230.$k$. The operation of the stored content controller 240 is described in greater detail in conjunction with FIG. 3, below.

Figure 3:
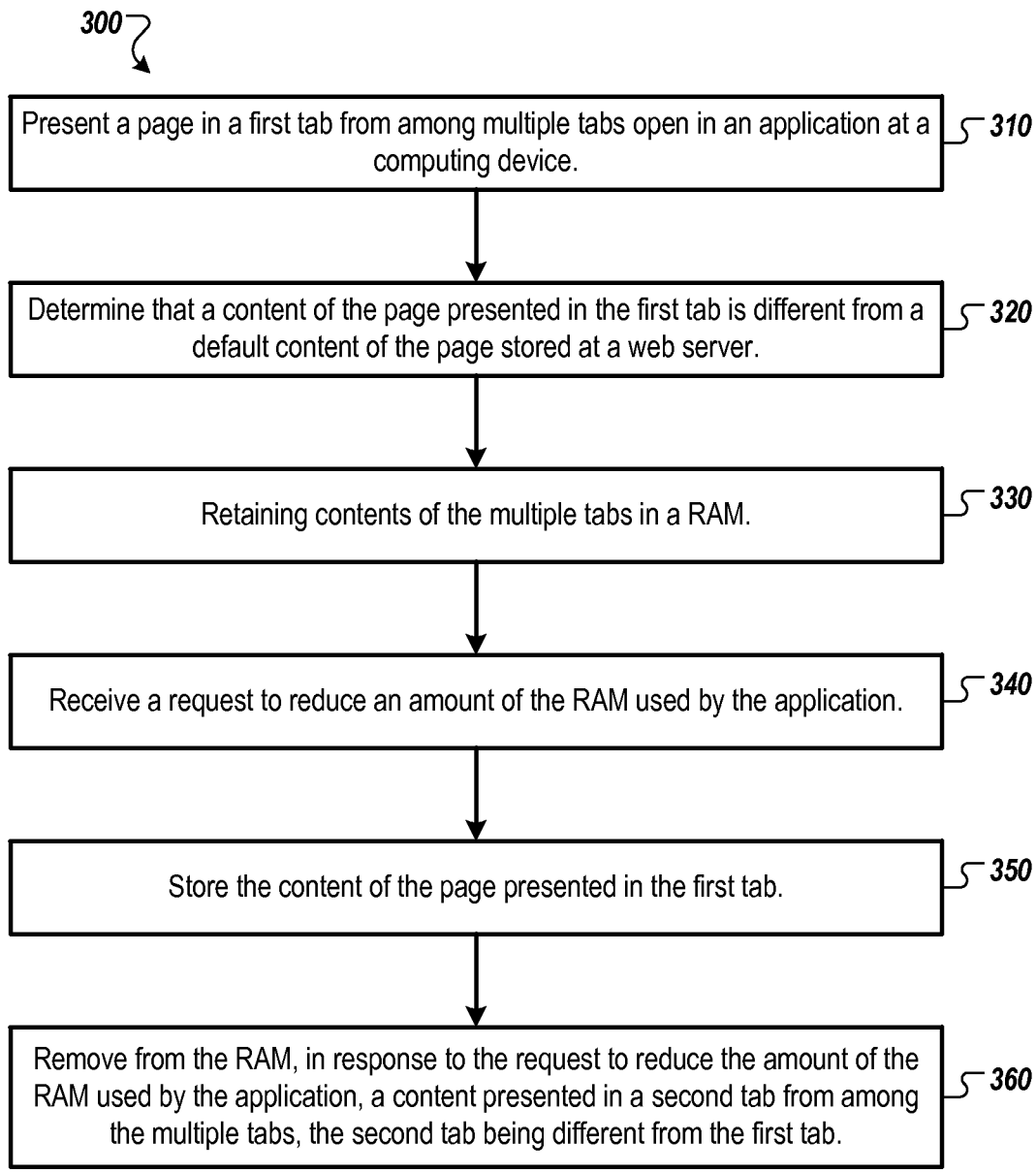
FIG. 3 illustrates an example process by which open tabs of an application may be managed.

FIG. 3 illustrates an example process 300 by which open tabs of an application may be managed.

The process 300 begins at step 310, where a computing device (e.g., computing device 110 executing stored content controller 240) presents a page (e.g., page 235.*k*) in a first tab (e.g., tab 230.*k*) from among multiple tabs (e.g., tabs 230.1-3, including tab 230.*k*) open in an application (e.g., application 225) at the computing device. The application may be a web browser or any other application. The page may be a webpage or a page in an application (e.g., a document in a document processor application).

In step 320, the computing device determines that a content of the page presented in the first tab is different from a default content of the page stored at a web server (e.g., web server 120) hosting the page. For example, a user of the computing device may enter text into an input box on the page. According to some examples, the steps 330-360 may be executed if the user enters any amount of text. Alternatively, the steps 330-360 may be executed if the user enters at least a threshold amount of text (e.g., at least five, ten, or twenty characters). The version of the page stored at the web server may lack the text entered by the user. In another example, the user may select a user interface component on the page (e.g., a minimize advertisement button) causing a change to the content of the page. The default content of the page, stored at the web server, may lack this change. In yet another example, the computing device may determine, based on a caching header of the content of the page presented in the first tab and a caching header of the default content of the page stored at the web server, that the default content of the page stored at the web server has been updated since the page was loaded in the first tab. The version of the page in the first tab may not have been updated.

In step 330, the computing device retains contents of the multiple tabs in a RAM (e.g., RAM 220) of the computing device. The contents of the multiple tabs may be retained in response to a user input for shifting focus away from the application, which may include selecting a minimize button in the application, pressing a home button to minimize the application and view a home screen of the computing device, or a selection of another application to receive focus in place of the application presenting the content of the page. Alternatively, the application may retain the contents of the multiple tabs while being focused and may evict tab(s) at that time. The contents of the multiple tabs may be retained in the RAM for fast reloading when/if the user re-accesses the application. According to some schemes, while lacking focus, the application may be killed without having a chance to respond to a memory warning. To remedy this problem, according to some implementations, when first losing focus, the application may store (e.g., at the disk) any information about changed content of tabs with the assumption that the application may be killed before regaining focus.

In step 340, the computing device receives a request to reduce an amount of RAM used by the application. For example, the application may receive a memory warning that another application, for instance, a currently active application, requests more RAM, and, therefore, that the application may reduce the amount of RAM that the application is using. In response to the request, the application may remove the content of one or more of the tabs of the application from the RAM.

In step 350, the computing device stores the content of the page (e.g., page 235.*k*) presented in the first tab (e.g., tab 230.*k*). For example, the computing device may cause the content of the page presented in the first tab to remain stored in the RAM of the computing device. Alternatively, the content of the page presented in the first tab may be stored at a disk (e.g., disk 215) of the computing device. In another alternative, the content of the page presented in the first tab may be stored at a content server (e.g., content server 130) in conjunction with an account of a user of the computing device. As a result, if the computing device is damaged (e.g., the user drops his/her mobile phone into a river), the user may access the content of the first tab via another computer and continue working on this content, which may be, for example, a blog post, a job application, an application for health insurance, etc. In some cases, if the content of the page presented in the first tab is stored at the disk or at the content server, the content of the page presented in the first tab may be removed from the RAM. As a result, the amount of the RAM used by the application may be reduced.

In step 360, the computing device removes from the RAM, in response to the request to reduce the amount of the RAM used by the application, a content (e.g., page 235.*m*, where m is a number between 1 and 3 different from k) presented in a second tab (e.g., tab 230.*m*) from among the multiple tabs. The second tab is different from the first tab. The content of the second tab (e.g., page 235.*m*) may be identical to a default version of the content of the second tab (e.g., a default version of page 235.*m*) stored at a web server (e.g., web server 120 or a different web server). After step 360, the process 300 ends.

Figure 4:
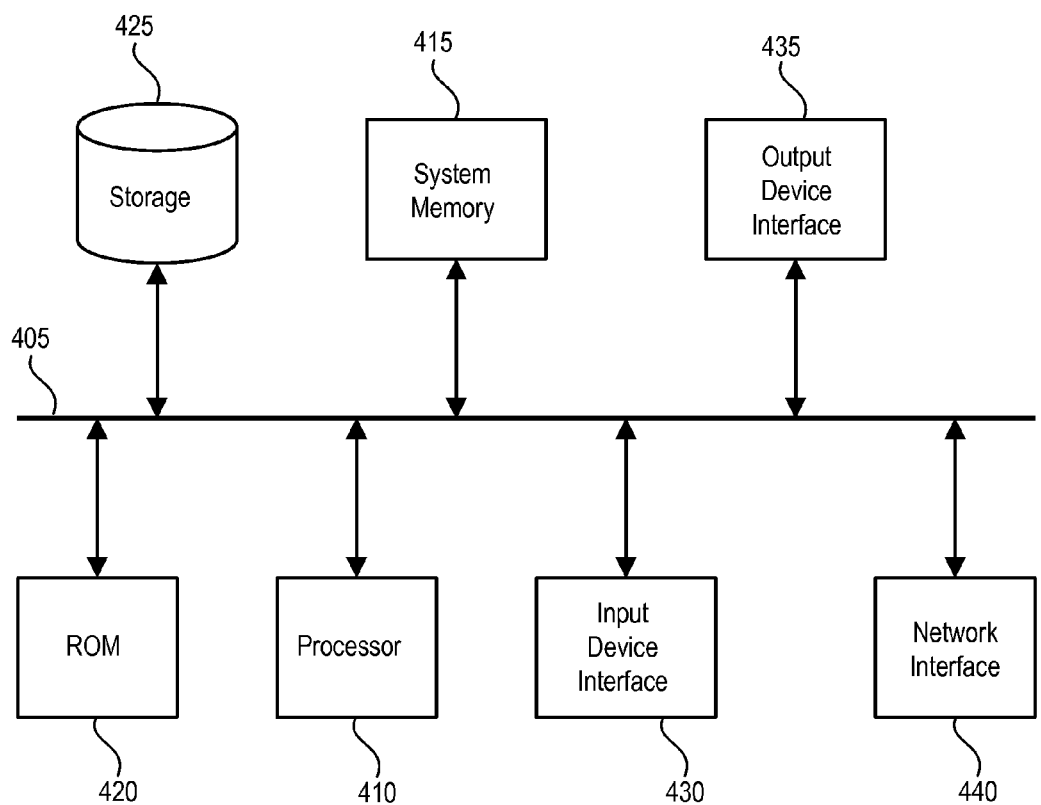
FIG. 4 conceptually illustrates an example electronic system with which some implementations of the subject technology are implemented.

FIG. 4 conceptually illustrates an electronic system 400 with which some implementations of the subject technology are implemented. For example, one or more of the computing device 110, the web server 120, or the content server 130 may be implemented using the arrangement of the electronic system 400. The electronic system 400 can be a computer (e.g., a mobile phone, PDA), or any other sort of electronic device. Such an electronic system includes various types of computer readable media and interfaces for various other types of computer readable media. Electronic system 400 includes a bus 405, processing unit(s) 410, a system memory 415, a read-only memory 420, a permanent storage device 425, an input device interface 430, an output device interface 435, and a network interface 440.

The bus 405 collectively represents all system, peripheral, and chipset buses that communicatively connect the numerous internal devices of the electronic system 400. For instance, the bus 405 communicatively connects the processing unit(s) 410 with the read-only memory 420, the system memory 415, and the permanent storage device 425.

From these various memory units, the processing unit(s) 410 retrieves instructions to execute and data to process in order to execute the processes of the subject technology. The processing unit(s) can be a single processor or a multi-core processor in different implementations.

The read-only-memory (ROM) 420 stores static data and instructions that are needed by the processing unit(s) 410 and other modules of the electronic system. The permanent storage device 425, on the other hand, is a read-and-write memory device. This device is a non-volatile memory unit that stores instructions and data even when the electronic system 400 is off. Some implementations of the subject technology use a mass-storage device (for example a magnetic or optical disk and its corresponding disk drive) as the permanent storage device 425.

Other implementations use a removable storage device (for example a floppy disk, flash drive, and its corresponding disk drive) as the permanent storage device 425. Like the permanent storage device 425, the system memory 415 is a read-and-write memory device. However, unlike storage device 425, the system memory 415 is a volatile read-and-write memory, such a random access memory. The system memory 415 stores some of the instructions and data that the processor needs at runtime. In some implementations, the processes of the subject technology are stored in the system memory 415, the permanent storage device 425, or the read-only memory 420. For example, the various memory units include instructions for managing open tabs of an application in accordance with some implementations. From these various memory units, the processing unit(s) 410 retrieves instructions to execute and data to process in order to execute the processes of some implementations.

The bus 405 also connects to the input and output device interfaces 430 and 435. The input device interface 430 enables the user to communicate information and select commands to the electronic system. Input devices used with input device interface 430 include, for example, alphanumeric keyboards and pointing devices (also called "cursor control devices"). Output device interfaces 435 enables, for example, the display of images generated by the electronic system 400. Output devices used with output device interface 435 include, for example, printers and display devices, for example cathode ray tubes (CRT) or liquid crystal displays (LCD). Some implementations include devices for example a touch screen that functions as both input and output devices.

Finally, as shown in FIG. 4, bus 405 also couples electronic system 400 to a network (not shown) through a network interface 440. In this manner, the electronic system 400 can be a part of a network of computers (for example a local area network (LAN), a wide area network (WAN), or an Intranet, or a network of networks, for example the Internet. Any or all components of electronic system 400 can be used in conjunction with the subject technology.

The above-described features and applications can be implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage or flash storage, for example, a solid-state drive, which can be read into memory for processing by a processor. Also, in some implementations, multiple software technologies can be implemented as sub-parts of a larger program while remaining distinct software technologies. In some implementations, multiple software technologies can also be implemented as separate programs. Finally, any combination of separate programs that together implement a software technology described here is within the scope of the subject technology. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

These functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, for example microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic or solid state hard drives, read-only and recordable Blu-Ray® discs, ultra density optical discs, any other optical or magnetic media, and floppy disks. The computer-readable media can store a computer program that is executable by at least one processing unit and includes sets of instructions for performing various operations. Examples of computer programs or computer code include machine code, for example is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, for example application specific integrated circuits (ASICs) or field programmable gate arrays (FPGAs). In some implementations, such integrated circuits execute instructions that are stored on the circuit itself.

As used in this specification and any claims of this application, the terms "computer", "server", "processor", and "memory" all refer to electronic or other technological devices. These terms exclude people or groups of people. For the purposes of the specification, the terms display or displaying means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

The subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network (LAN) and a wide area network (WAN), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some aspects of the disclosed subject matter, a server transmits data (e.g., an HTML page) to a client device (e.g., for purposes of displaying data to and receiving user input from a user interacting with the client device). Data generated at the client device (e.g., a result of the user interaction) can be received from the client device at the server.

It is understood that any specific order or hierarchy of steps in the processes disclosed is an illustration of example approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components illustrated above should not be understood as requiring such separation, and it should be understood that the described program components and systems can generally be integrated together in a single software product or packaged into multiple software products.

Various modifications to these aspects will be readily apparent, and the generic principles defined herein may be applied to other aspects. Thus, the claims are not intended to be limited to the aspects shown herein, but is to be accorded the full scope consistent with the language claims, where reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase, for example, an "aspect" does not imply that the aspect is essential to the subject technology or that the aspect applies to all configurations of the subject technology. A disclosure relating to an aspect may apply to all configurations, or one or more configurations. A phrase, for example, an aspect may refer to one or more aspects and vice versa. A phrase, for example, a "configuration" does not imply that such configuration is essential to the subject technology or that such configuration applies to all configurations of the subject technology. A disclosure relating to a configuration may apply to all configurations, or one or more configurations. A phrase, for example, a configuration may refer to one or more configurations and vice versa.

What is claimed is:

1. A method for storing content of an application, the method comprising:
    presenting a plurality of tabs open in an application at a computing device;
    determining that content of a first page presented in a first tab of the plurality of tabs is different from default content of the first page stored at a first web server;
    retaining contents of the plurality of tabs in a random access memory (RAM);
    receiving a request to reduce an amount of the RAM used by the application;
    in response to receiving the request to reduce the amount of the RAM and based on the content of the first page presented in the first tab being different from the default content of the first page, storing, in a storage that is different than the RAM, the content of the first page presented in the first tab; and
    further in response to receiving the request to reduce the amount of the RAM and based on content of a second page presented in a second tab from among the plurality of tabs being identical to default content of the second page stored at a second web server, the second tab being different from the first tab, removing the content of the second page from the RAM.

2. The method of claim 1, wherein storing the content of the first page presented in the first tab comprises:
    foregoing removing from the RAM, in response to the request to reduce the amount of the RAM used by the application, the content of the first page presented in the first tab.

3. The method of claim 1, wherein the contents of the plurality of tabs are retained in the RAM in response to the computing device shifting focus away from the application, and wherein storing the content of the first page presented in the first tab comprises:
    storing, at a disk, in response to the request to reduce the amount of the RAM used by the application, the content of the first page presented in the first tab; and
    removing from the RAM, in response to the request to reduce the amount of the RAM used by the application, the content of the first page presented in the first tab.

4. The method of claim 3, further comprising:
    receiving, after removing the content of the first page presented in the first tab from the RAM, a request to present the first tab; and
    presenting, in response to the request to present the first tab, the content of the first page presented in the first tab stored at the disk.

5. The method of claim 1, wherein determining that the content of the first page presented in the first tab is different from the default content of the first page stored at the first web server comprises:
  determining that a user at the computing device has entered text into an input box of the first page, wherein the default content of the first page stored at the first web server lacks the text entered by the user.

6. The method of claim 1, wherein determining that the content of the first page presented in the first tab is different from the default content of the first page stored at the first web server comprises:
  determining that a user at the computing device has selected a user interface component causing a change to the content of the first page, wherein the default content of the first page stored at the first web server lacks the caused change to the content.

7. The method of claim 1, wherein determining that the content of the first page presented in the first tab is different from the default content of the first page stored at the first web server comprises:
  determining, based on a caching header of the content of first page presented in the first tab and a caching header of the default content of the first page stored at the first web server, that the default content of the first page stored at the first web server has been updated since the first page was loaded in the first tab.

8. The method of claim 1, wherein receiving the request to reduce the amount of the RAM used by the application comprises:
  receiving, at the application, a memory warning.

9. The method of claim 1, wherein the content of the first page presented in the first tab is stored at a content server and in association with a user account, and wherein the content of the first page presented in the first tab is accessible via a second computing device having access to the user account, the second computing device being different from the computing device.

10. A non-transitory computer-readable medium comprising instructions which, when executed by a computer, cause the computer to implement a method, the method comprising:
  presenting a plurality of tabs open in an application at the computer;
  determining that content of a first page presented in a first tab of the plurality of tabs is different from default content of the first page stored at a first web server;
  retaining contents of the plurality of tabs in a random access memory (RAM);
  receiving a request to reduce an amount of the RAM used by the application;
  in response to receiving the request to reduce the amount of the RAM and based on the content of the first page being different from the default content of the first page, storing, in a storage that is different than the RAM, the content of the first page presented in the first tab;
  further in response to receiving the request to reduce the amount of the RAM and based on content of a second page presented in a second tab from among the plurality of tabs being identical to default content of the second page storage at a second web server, the second tab being different from the first tab, removing the content of the second page from the RAM.

11. The non-transitory computer-readable medium of claim 10, wherein storing the content of the first page presented in the first tab comprises:
  foregoing removing from the RAM, in response to the request to reduce the amount of the RAM used by the application, the content of the first page presented in the first tab.

12. The non-transitory computer-readable medium of claim 10, wherein the contents of the plurality of tabs are retained in the RAM in response to the computer shifting focus away from the application, and wherein storing the content of the first page presented in the first tab comprises:
  storing, at a disk, in response to the request to reduce the amount of the RAM used by the application, the content of the first page presented in the first tab; and
  removing from the RAM, in response to the request to reduce the amount of the RAM used by the application, the content of the first page presented in the first tab.

13. The non-transitory computer-readable medium of claim 10, wherein determining that the content of the first page presented in the first tab is different from the default content of the first page stored at the first web server comprises:
  determining that a user at the computer has entered text into an input box of the first page, wherein the default content of the first page stored at the first web server lacks the text entered by the user.

14. The non-transitory computer-readable medium of claim 10, wherein determining that the content of the first page presented in the first tab is different from the default content of the first page stored at the first web server comprises:
  determining that a user at the computer has selected a user interface component causing a change to the content of the first page, wherein the default content of the first page stored at the first web server lacks the caused change to the content.

15. The non-transitory computer-readable medium of claim 10, wherein determining that the content of the first page presented in the first tab is different from the default content of the first page stored at the first web server comprises:
  determining, based on a caching header of the content of the first page presented in the first tab and a caching header of the default content of the first page stored at the first web server, that the default content of the first page stored at the first web server has been updated since the first page was loaded in the first tab.

16. The non-transitory computer-readable medium of claim 10, wherein receiving the request to reduce the amount of the RAM used by the application comprises:
  receiving, at the application, a memory warning.

17. A computing device comprising:
  one or more processors;
  a random access memory (RAM); and
  a disk storing instructions which, when executed by the one or more processors, cause the one or more processors to implement a method, the method comprising:
    presenting a plurality of tabs open in an application at the computing device;
    determining that content of a first page presented in a first tab is different from default content of the first page stored at a first web server;
    retaining contents of the plurality of tabs in the RAM;
    receiving a request to reduce an amount of the RAM used by the application;
    in response to receiving the request to reduce the amount of the RAM and based on the content of the first page presented in the first tab being different from the default content, storing, in a storage that is different from the RAM, and foregoing removing from the RAM the content of the first page presented in the first tab; and further in response to receiving the request to reduce the amount of RAM and based on content of a second page presented in a second tab from among the plurality of tabs being identical to default content of the second page storage at a second web server, removing from the RAM the content of the second page presented in the second tab.

18. The computing device of claim 17, wherein determining that the content of the first page presented in the first tab is different from the default content of the first page stored at the first web server comprises:

determining that a user at the computing device has entered text into an input box of the first page, wherein the default content of the first page stored at the first web server lacks the text entered by the user.

19. The computing device of claim 17, wherein determining that the content of the first page presented in the first tab is different from the default content of the first page stored at the first web server comprises:

determining that a user at the computing device has selected a user interface component causing a change to the content of the first page, wherein the default content of the first page stored at the first web server lacks the caused change to the content.

* * * * *